(12) United States Patent
Yoshinari et al.

(10) Patent No.: US 10,526,693 B2
(45) Date of Patent: Jan. 7, 2020

(54) CONDUCTIVE LAMINATE FOR TOUCH PANEL AND METHOD FOR PRODUCING CONDUCTIVE LAMINATE FOR TOUCH PANEL

(71) Applicant: VTS-TOUCHSENSOR CO., LTD., Higashiomi-Shi (JP)

(72) Inventors: Tomo Yoshinari, Taito-ku (JP); Arifumi Hashimoto, Taito-ku (JP)

(73) Assignee: VTS-TOUCHSENSOR CO., LTD., Higashiomi-shi (JP)

( * ) Notice: Subject to any disclaimer, the term of this patent is extended or adjusted under 35 U.S.C. 154(b) by 69 days.

(21) Appl. No.: 15/686,238

(22) Filed: Aug. 25, 2017

(65) Prior Publication Data
US 2017/0349998 A1 Dec. 7, 2017

Related U.S. Application Data

(63) Continuation of application No. PCT/JP2015/086361, filed on Dec. 25, 2015.

(30) Foreign Application Priority Data

Feb. 25, 2015 (JP) .................. 2015-035707

(51) Int. Cl.
*C23C 14/14* (2006.01)
*C23C 14/00* (2006.01)
(Continued)

(52) U.S. Cl.
CPC .............. *C23C 14/14* (2013.01); *B32B 9/00* (2013.01); *B32B 15/08* (2013.01); *B32B 15/082* (2013.01);
(Continued)

(58) Field of Classification Search
CPC ..................... C23C 14/0676; B32B 2457/208
See application file for complete search history.

(56) References Cited

U.S. PATENT DOCUMENTS

2013/0157010 A1* 6/2013 Takada ................. H05K 1/0298
428/147
2013/0215067 A1 8/2013 Hwang et al.
(Continued)

FOREIGN PATENT DOCUMENTS

JP 2011-028699 A 2/2011
JP 2013-129183 7/2013
(Continued)

OTHER PUBLICATIONS

International Search Report dated Feb. 2, 2016 in PCT/JP2015/086361, filed Dec. 25, 2015.
Office Action dated Aug. 6, 2019 in Japanese Patent Application No. 2017-501882 (with English translation), 6 pgs.

*Primary Examiner* — Ian A Rummel
(74) *Attorney, Agent, or Firm* — Oblon, McClelland, Maier & Neustadt, L.L.P.

(57) ABSTRACT

A conductive laminate for a touch panel including a substrate which is light-transmitting, an underlayer which is light-transmitting and formed on at least one surface of the substrate, a first copper oxynitride layer formed on the underlayer on an opposite side of the substrate, a copper layer formed on the first copper oxynitride layer on an opposite side of the underlayer, and a second copper oxynitride layer formed on the copper layer on an opposite side of the first copper oxynitride layer.

12 Claims, 3 Drawing Sheets

(51) Int. Cl.
*C23C 14/06* (2006.01)
*C23C 14/02* (2006.01)
*G06F 3/041* (2006.01)
*B32B 9/00* (2006.01)
*B32B 15/08* (2006.01)
*B32B 15/082* (2006.01)
*B32B 15/20* (2006.01)

(52) U.S. Cl.
CPC .......... *B32B 15/20* (2013.01); *C23C 14/0036* (2013.01); *C23C 14/024* (2013.01); *C23C 14/06* (2013.01); *C23C 14/0676* (2013.01); *G06F 3/041* (2013.01); *B32B 2457/208* (2013.01); *G06F 2203/04103* (2013.01)

(56) References Cited

U.S. PATENT DOCUMENTS

| | | | |
|---|---|---|---|
| 2014/0345917 A1 | 11/2014 | Takada et al. | |
| 2015/0205326 A1* | 7/2015 | Lim | B32B 15/04 345/174 |
| 2016/0291712 A1* | 10/2016 | Lim | G06F 3/041 |

FOREIGN PATENT DOCUMENTS

| | | |
|---|---|---|
| JP | 2013-129183 A | 7/2013 |
| JP | 2013-540331 | 10/2013 |
| JP | 2013-540331 A | 10/2013 |
| JP | 2015-5272 | 1/2015 |
| JP | 2015-005272 A | 1/2015 |
| JP | 2015-5495 | 1/2015 |
| JP | 2015-005495 A | 1/2015 |

* cited by examiner

CONDUCTIVE LAMINATE FOR TOUCH PANEL AND METHOD FOR PRODUCING CONDUCTIVE LAMINATE FOR TOUCH PANEL

CROSS-REFERENCE TO RELATED APPLICATIONS

The present application is a continuation of International Application No. PCT/JP2015/086361, filed Dec. 25, 2015, which is based upon and claims the benefits of priority to Japanese Application No. 2015-035707, filed Feb. 25, 2015. The entire contents of these applications are incorporated herein by reference.

BACKGROUND OF THE INVENTION

Field of the Invention

The present invention relates to a conductive laminate used for forming electrodes for a touch sensor that constitutes a touch panel, and a method for producing a conductive laminate for a touch panel.

Discussion of the Background

A touch sensor provided in a touch panel includes a plurality of electrodes. Materials for forming the plurality of electrodes include a metal such as copper for the purpose of decreasing resistance of the electrodes (for example, see JP-A-2011-28699).

SUMMARY OF THE INVENTION

According to an aspect of the present invention, a conductive laminate for a touch panel includes a substrate which is light-transmitting, an underlayer which is light-transmitting and formed on at least one surface of the substrate, a first copper oxynitride layer formed on the underlayer on an opposite side of the substrate, a copper layer formed on the first copper oxynitride layer on an opposite side of the underlayer, and a second copper oxynitride layer formed on the copper layer on an opposite side of the first copper oxynitride layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

With reference to FIGS. 1 to 8, an embodiment of a conductive laminate for a touch panel and a method for producing a conductive laminate for a touch panel will be described. In the following description, a configuration of a conductive laminate for a touch panel, a method for producing a conductive laminate for a touch panel, an operation of a conductive laminate for a touch panel, and examples will be individually described.

Configuration of Conductive Laminate for Touch Panel

Figure 1:
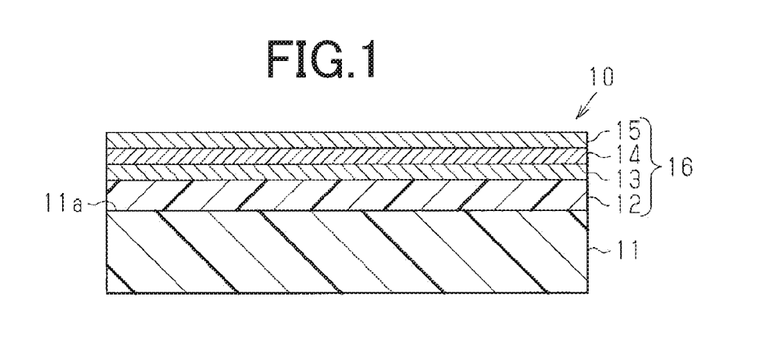
FIG. 1 is a schematic cross-sectional view which illustrates a cross-sectional structure of an example of a conductive laminate for a touch panel according to one embodiment of a conductive laminate for a touch panel of the present invention.
Figure 2:
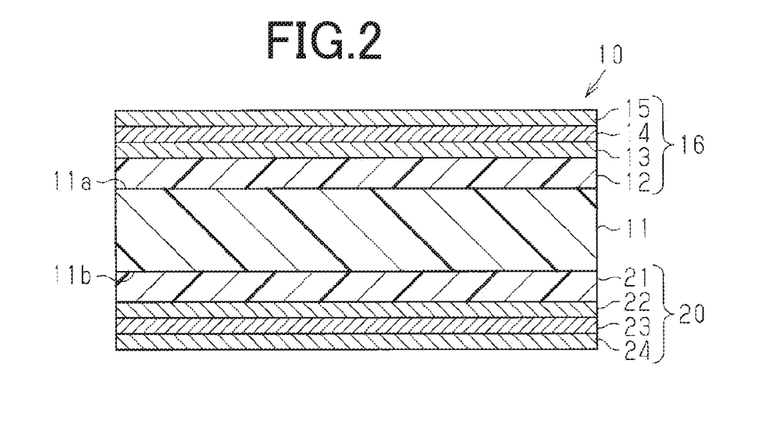
FIG. 2 is a schematic cross-sectional view which illustrates a cross-sectional structure of an example of a conductive laminate for a touch panel.

With reference to FIGS. 1 and 2, a configuration of a conductive laminate for a touch panel will be described. The cross-sectional structure of a conductive laminate for a touch panel shown in FIG. 1 is a cross-sectional structure of an example of a conductive laminate for a touch panel, and the cross-sectional structure of a conductive laminate for a touch panel shown in FIG. 2 is a cross-sectional structure of another example of a conductive laminate for a touch panel.

As shown in FIG. 1, a conductive laminate 10 for a touch panel includes a substrate 11, an underlayer 12, a lower copper oxynitride layer 13, a copper layer 14, and an upper copper oxynitride layer 15. The underlayer 12, the lower copper oxynitride layer 13, the copper layer 14, and the upper copper oxynitride layer 15 constitute a first laminate 16.

The substrate 11 is light-transmitting, and includes one surface, which is a first surface 11a. The underlayer 12 is formed on the first surface 11a of the substrate 11. The lower copper oxynitride layer 13 is formed on a surface of the underlayer 12 opposite to a surface that is in contact with the substrate 11. The copper layer 14 is formed on a surface of the lower copper oxynitride layer 13 opposite to a surface that is in contact with the underlayer 12. The upper copper oxynitride layer 15 is formed on a surface of the copper layer 14 opposite to a surface that is in contact with the lower copper oxynitride layer 13.

That is, the underlayer 12 is disposed on the first surface 11a of the substrate 11, the lower copper oxynitride layer 13 is disposed on the surface of the underlayer 12 opposite to the surface that is in contact with the substrate 11, and the copper layer 14 is formed on the surface of the lower copper oxynitride layer 13 opposite to the surface that is in contact with the underlayer 12. The upper copper oxynitride layer 15 is disposed on the surface of the copper layer 14 opposite to the surface that is in contact with the lower copper oxynitride layer 13.

The substrate 11 is preferably made of a light-transmitting resin, and a material for forming the substrate 11 may be, for example, polyethylene terephthalate, polyethylene naphthalate, polyethylene, polypropylene, polystyrene, polycarbonate, polyamide or polyimide. A thickness of the substrate 11 is, for example, in a range between several tens of micrometers and several hundreds of micrometers.

The underlayer 12 is a layer having adhesiveness to both the substrate 11 and the lower copper oxynitride layer 13, and prevents the lower copper oxynitride layer 13 from being peeled off from the substrate 11. The underlayer 12 is a layer which is preferably light-transmitting and made of coating liquid composed of a plurality of resin materials. The thickness of the underlayer 12 is, for example, several micrometers.

The coating liquid for forming the underlayer 12 includes ultraviolet-curable multifunctional acrylate, ultraviolet-curable monofunctional acrylate, acrylic polymer, and an anti-blocking agent. In other words, the underlayer 12 includes ultraviolet-curable multifunctional acrylate, ultraviolet-curable monofunctional acrylate, acrylic polymer, and an anti-blocking agent. Among these, the ultraviolet-curable multifunctional acrylate is a diluent having a function of determining the shape of the underlayer 12, and the ultraviolet-curable monofunctional acrylate is a diluent having reactivity to curing by ultraviolet light.

The acrylic polymer has adhesiveness to both the substrate 11 and the lower copper oxynitride layer 13, and the acrylic polymer includes an ultraviolet-curable acrylic group and a functional group which contributes to adhesiveness. The anti-blocking agent reduces adhesiveness of a surface of the upper copper oxynitride layer 15 opposite to a surface that is in contact with the copper layer 14. The anti-blocking agent is preferably particles made of, for example, acrylic resin, silicone resin, and silica, and a particle diameter of the particle is preferably in the order of several hundreds of nanometers. When the thickness of the underlayer 12 is 1 µm, for example, the particle diameter of the particle is preferably in a range of 100 nm or more and 500 nm or less.

Since the coating liquid for forming the underlayer 12, and thus the underlayer 12 includes an anti-blocking agent, the surface of the upper copper oxynitride layer 15 opposite to the surface that is in contact with the copper layer 14 has roughness conforming to the shape of the particles of the anti-blocking agent. This reduces contact points between the upper copper oxynitride layer 15 and the substrate 11 laminated on the upper copper oxynitride layer 15 when the conductive laminate 10 for a touch panel is wound up or stacked.

As a result, the upper copper oxynitride layer 15 is prevented from being adhered to the substrate 11 laminated on the upper copper oxynitride layer 15, that is, blocking of the upper copper oxynitride layer 15 is reduced. In addition, the surface of the substrate 11 which is soft compared with the upper copper oxynitride layer 15 is prevented from being damaged by the upper copper oxynitride layer 15.

An adhesion strength at the interface between the underlayer 12 and the lower copper oxynitride layer 13 is preferably 8.0 N/15 mm or more. The adhesion strength at the interface between the underlayer 12 and the lower copper oxynitride layer 13 is a value measured by a method in accordance with JIS K 6854-3.

When the adhesion strength is 8.0 N/15 mm or more, part of electrodes formed by patterning the conductive laminate 10 for a touch panel is resistant to peeling off from the underlayer 12 during patterning, and thus disconnection in electrodes can be reduced.

The surface of the underlayer 12 that is in contact with the lower copper oxynitride layer 13 is a front surface, and a surface roughness Ra of the front surface is preferably in a range of 3 nm or more and 20 nm or less, and more preferably in a range of 5 nm or more and 10 nm or less. The surface roughness Ra of the underlayer 12 is a value measured by a method in accordance with JIS B 0601.

When the surface roughness Ra of the surface of the underlayer 12 is 3 nm or more, the first laminate 16 readily obtains anti-blocking properties compared with a configuration with the surface roughness Ra of less than 3 nm. The anti-blocking properties refer to the characteristic that prevents blocking between the upper copper oxynitride layer 15 and the substrate 11 laminated on the upper copper oxynitride layer 15.

Further, when the surface roughness Ra of the surface of the underlayer 12 is 20 nm or less, the haze value of the first laminate 16 is prevented from increasing to the extent by which scattering of light at the electrodes formed of the first laminate 16 is visually recognized by a user of the touch panel. Moreover, when the surface roughness Ra of the surface of the underlayer 12 is 20 nm or less, pinholes or cracks are prevented from occurring on the lower copper oxynitride layer 13 formed on the surface of the underlayer 12.

As described above, in order to ensure that the first laminate 16 has anti-blocking properties and prevent an increase in the haze value of the first laminate 16, it is preferred that the surface roughness Ra of the surface of the underlayer 12 is in a range of 3 nm or more and 20 nm or less.

In addition, in the configuration in which the underlayer 12 includes an anti-blocking agent, the surface roughness Ra of the surface of the underlayer 12 can be controlled by the degree of dispersion of the anti-blocking agent in the underlayer 12. When the anti-blocking agent is uniformly dispersed in the underlayer 12, the surface of the underlayer 12 has improved smoothness. On the other hand, when the anti-blocking agent is unduly aggregated in the underlayer 12, a portion of the upper copper oxynitride layer 15 which overlaps the aggregated part of the anti-blocking agent is visually recognized as a raised portion which is raised from the other portions.

Accordingly, in order to ensure that the surface roughness Ra of the surface of the underlayer 12 is included in the range of 3 nm or more and 20 nm or less, it is preferred that the anti-blocking agent is aggregated in the underlayer 12 to the extent by which a raised portion of a visually recognizable size is not formed in the upper copper oxynitride layer 15.

A hardness of the surface of the underlayer 12 is preferably HB or more, and more preferably H or more. The hardness of the underlayer 12 is a scratch hardness measured by a method in accordance with the pencil method specified under JIS K 5600-5-4.

The smaller the hardness of the underlayer 12, the lower the hardness of the surface of the underlayer 12. Accordingly, the surface of the underlayer 12 is likely to have more scratches. As a result, the lower copper oxynitride layer 13, the copper layer 14, and the upper copper oxynitride layer 15 disposed on the surface of the underlayer 12 are also likely to have depressions conforming to the scratches on the underlayer 12. When the electrodes are composed of a laminate made up of the lower copper oxynitride layer 13, the copper layer 14, and the upper copper oxynitride layer 15, such depressions may cause disconnection in the electrodes.

Further, the lower the hardness of the surface of the underlayer 12, the more the underlayer 12 deforms due to a stress extremely applied to the underlayer 12. When the underlayer 12 excessively deforms, the lower copper oxynitride layer 13 formed on the surface of the underlayer 12 fails to conform to the deformation of the underlayer 12. As a result, the lower copper oxynitride layer 13 may have cracks or may be peeled off from the underlayer 12.

In this regard, the pencil hardness of the surface of the underlayer 12 in a range of HB or more can reduce disconnection in the electrodes, cracks in the lower copper oxynitride layer 13, and peeling of the lower copper oxynitride layer 13.

The lower copper oxynitride layer 13 is a layer made of copper oxynitride (CuNO).

Compared with the copper oxynitride layer, a copper nitride layer is chemically unstable and tends to be reactive to oxygen in the air during the initial period of formation that is, during a short period elapsed after the formation. As a consequence, the composition of the copper nitride layer, and thus the optical characteristics of the copper nitride layer tend to vary during the initial period of formation. Accordingly, there is a large difference between the optical characteristics at the time of formation of the copper nitride layer and the optical characteristics when a short period of time has elapsed after the formation. Therefore, it is difficult to obtain required optical characteristics of the copper nitride layer.

On the other hand, the copper oxynitride layer, which contains oxygen when compared with the copper nitride layer, can reduce variation in composition during the initial period of formation and variation in optical characteristics.

In the lower copper oxynitride layer 13, an initial value of Y value, which is one of the tristimulus values in the XYZ color system in accordance with JIS Z 8722, that is, the Y value at the time of formation of the lower copper oxynitride layer 13 is preferably 20% or less. The Y value of the tristimulus values is an index of lightness. The larger the Y value, the higher the lightness. Moreover, the thickness of the lower copper oxynitride layer 13 is preferably in a range of 30 nm or more and 50 nm or less, and also 25% or less of the thickness of the copper layer 14.

Since the thickness of the lower copper oxynitride layer 13 is in a range of 30 nm or more and 50 nm or less, the lower copper oxynitride layer 13 has a thickness sufficient to enhance adhesiveness between the substrate 11 on which the underlayer 12 is formed and the copper layer 14. Furthermore, since the thickness of the lower copper oxynitride layer 13 is 25% or less of the thickness of the copper layer 14, the entire thickness of the conductive laminate 10 for a touch panel and the amount of copper used in the conductive laminate 10 for a touch panel can be prevented from excessively increasing while maintaining adhesiveness between the substrate 11 and the copper layer 14.

The lower copper oxynitride layer 13 contains oxygen atoms preferably in a range of 4% by atom or more and 19% by atom or less, and more preferably in a range of 4% by atom or more and 12% by atom or less. According to the above lower copper oxynitride layer 13, the lower copper oxynitride layer 13 has an improved durability against change in the optical characteristics, that is, an improved temporal stability of the optical characteristics since the lower copper oxynitride layer 13 contains oxygen atoms to the extent that the composition of the lower copper oxynitride layer 13 does not easily vary.

When a touch panel having the electrode formed by using the conductive laminate 10 for a touch panel is used as a surface of the display, variation in optical characteristics of the lower copper oxynitride layer 13 appears as change in reflection colors on the surface of the display. Accordingly, improvement in temporal stability of optical characteristics in the lower copper oxynitride layer 13 can reduce variation in hue including reflection colors in a plurality of displays. Therefore, the commercial value of the displays as industrial products is increased.

Moreover, optical characteristics of the lower copper oxynitride layer 13 are specified by a plurality of parameters that determine optical characteristics of the lower copper oxynitride layer 13. These parameters are composed of the aforementioned Y value of the tristimulus values in the XYZ color system, and L* value a* value, and b* value in the Lab color system. The L* value in the Lab color system is a lightness index, that is, an index of lightness, and the a* value and the b* value are chromaticity indices, that is, indices of hue and chroma.

As described above, of the initial values of the optical characteristics of the lower copper oxynitride layer 13, the initial value of Y is preferably 20% or less. Further, an initial value of L* is preferably 55 or less. An initial value of a* and an initial value of b* are preferably negative values, and more preferably negative values and 5 or more and 20 or less in absolute value.

When the lower copper oxynitride layer 13 contains oxygen atoms in a range of 4% by atom or more and 19% by atom or less, the initial values of the optical characteristics of the lower copper oxynitride layer 13 are within the preferred ranges described above.

Further, when ferric chloride solution is used as an etchant, the etching rate of the lower copper oxynitride layer 13 decreases with decrease in the amount of oxygen atoms contained in the lower copper oxynitride layer 13. Accordingly, a difference between the etching rate of the lower copper oxynitride layer 13 and the etching rate of the copper layer 14 increases. In other words, the etching rate of the lower copper oxynitride layer 13 increases with increase in the amount of oxygen atoms contained in the lower copper oxynitride layer 13. Accordingly, a difference between the etching rate of the lower copper oxynitride layer 13 and the etching rate of the copper layer 14 decreases.

The smaller the difference between the etching rate of the lower copper oxynitride layer 13 and the etching rate of the copper layer 14, the smaller the difference between the line width in the lower copper oxynitride layer 13 and the line width in the copper layer 14, which occurs during formation of electrodes by etching the lower copper oxynitride layer 13 and the copper layer 14. Accordingly, occurrence of disconnection in the electrodes is reduced.

As a result, in order to improve processability by wet etching in the laminate which includes the lower copper oxynitride layer 13 and the copper layer 14, the lower copper oxynitride layer 13 contains oxygen atoms preferably in a range of 12% by atom or more and 42% by atom or less, and more preferably in a range of 19% by atom or more and 42% by atom or less.

The copper layer 14 is a layer made of copper (Cu), and the thickness of the copper layer 14 is preferably in a range of 200 nm or more and 500 nm or less.

The upper copper oxynitride layer 15 is a layer made of copper oxynitride (CuNO). In the upper copper oxynitride layer 15, the initial value of Y value, which is one of the tristimulus values in the XYZ colorimetric system described above, that is, the Y value at the time of formation of the upper copper oxynitride layer 15 is preferably 20% or less. Further, the initial value of L* in the upper copper oxynitride layer 15 is preferably 55 or less. The initial value of a* and the initial value of b* are preferably negative values, and more preferably negative values and 5 or more and 20 or less in absolute value. Further, the thickness of the upper copper oxynitride layer 15 is preferably in a range of 30 nm or more and 50 nm or less.

As with the aforementioned lower copper oxynitride layer 13, in order to improve durability against change in optical characteristics in the upper copper oxynitride layer 15, the upper copper oxynitride layer 15 contains oxygen atoms preferably in a range of 4% by atom or more and 19% by atom or less, and more preferably in a range of 4% by atom or more and 12% by atom or less.

Further, in order to improve processability by wet etching in the laminate which includes the upper copper oxynitride layer 15, the upper copper oxynitride layer 15 contains oxygen atoms preferably in a range of 12% by atom or more and 42% by atom or less, and more preferably in a range of 19% by atom or more and 42% by atom or less.

In the conductive laminate 10 for a touch panel described above, since the copper layer 14 is sandwiched between the lower copper oxynitride layer 13 and the upper copper oxynitride layer 15, the copper layer 14 is resistant to oxidation compared with a configuration which does not include two copper oxynitride layers.

In the first laminate 16, the laminate composed of the lower copper oxynitride layer 13, the copper layer 14 and the upper copper oxynitride layer 15 preferably has a surface resistivity of 0.13 Ω/sq. or less. In the layers that constitute the conductive laminate 10 for a touch panel, the lower copper oxynitride layer 13 and the upper copper oxynitride layer 15 are made of a compound having a resistance higher than that of the copper layer 14. However, with these copper oxynitride layers, the surface resistance of the laminate described above in the first laminate 16 can be prevented from increasing to the extent that it becomes incompatible with the electrodes provided in the touch panel.

Even if the conductive laminate 10 for a touch panel includes the above compound layers having high resistance, the following effects can be achieved as long as the surface resistivity of the laminate described above in the first laminate 16 is 0.13 Ω/sq. or less. That is, the resistance of the electrodes formed by using the conductive laminate 10 for a touch panel is so small that it rarely affects the response speed of the touch sensor.

As shown in FIG. 2, the surface of the substrate 11 opposite to the first surface 11a is the second surface 11b, and a second laminate 20 may be disposed on the second surface 11b. While the second laminate 20 is located at a position relative to the substrate 11 different from that of the first laminate 16, the second laminate 20 has a layer structure in the laminated direction of the layers which is the same as that of the first laminate 16. That is, the second laminate 20 is composed of the underlayer 21, the lower copper oxynitride layer 22, the copper layer 23, and the upper copper oxynitride layer 24.

In addition, the lower copper oxynitride layers 13 and 22 are examples of the first copper oxynitride layer, and the upper copper oxynitride layers 15 and 24 are examples of the second copper oxynitride layer.

Method for Producing Conductive Laminate for Touch Panel

Figure 3:
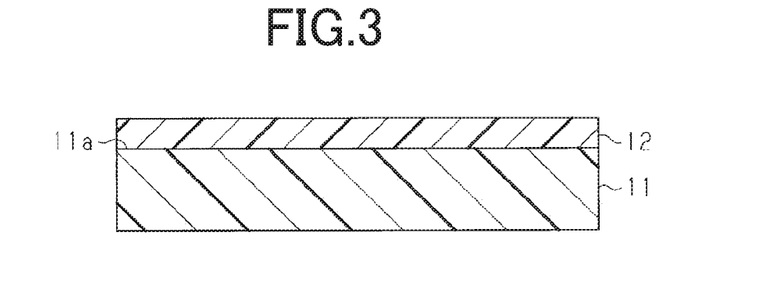
FIG. 3 is a process diagram which illustrates a step of producing an underlayer in a method for producing a conductive laminate for a touch panel.
Figure 4:
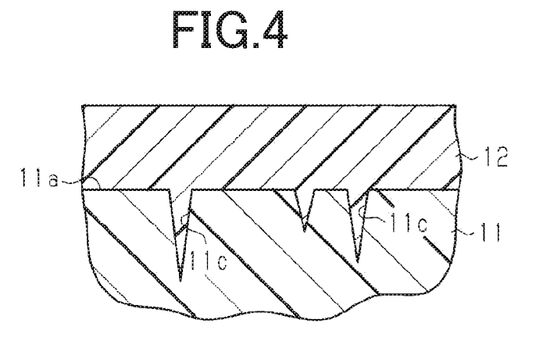
FIG. 4 is a partially enlarged cross-sectional view which illustrates part of the substrate and the underlayer in an enlarged manner.

With reference to FIGS. 3 to 6, a method for producing a conductive laminate for a touch panel will be described. In FIG. 4, for the convenience of description of part of the first surface 11a of the substrate 11, part of the substrate 11 and part of the underlayer 12 are enlarged. Further, a step of forming the second laminate 20 on the second surface 11b of the substrate 11 is the same as the step of forming the first laminate 16 on the first surface 11a, except for the surface on which the laminate is formed. Accordingly, in the following description, the step of forming the first laminate 16 will be described, and the description of the step of forming the second laminate 20 is omitted.

As shown in FIG. 3, in forming the conductive laminate 10 for a touch panel, the underlayer 12 is first formed on the first surface 11a of the substrate 11. In a step of forming the underlayer 12, a coating liquid including a plurality of resin materials described above is used to form a coating film on the first surface 11a of the substrate 11. Then, as the coating film cures, the underlayer 12 is formed.

As shown in FIG. 4, the underlayer 12 fills a plurality of recesses 11c formed on the first surface 11a of the substrate 11, and is disposed on the first surface 11a as a layer. As a result, the surface of the underlayer 12 that is in contact with the lower copper oxynitride layer 13 has an improved flatness. Accordingly, each of the layers in the conductive laminate 10 for a touch panel has an improved flatness.

Further, a depth of the recesses 11c formed on the first surface 11a of the substrate 11 is significantly larger than that of the surface roughness Ra of the underlayer 12 described above. Therefore, the underlayer 12 can have the surface roughness Ra of the surface of the underlayer 12 within the range described above, while improving the flatness by filling the recesses 11c.

Figure 5:
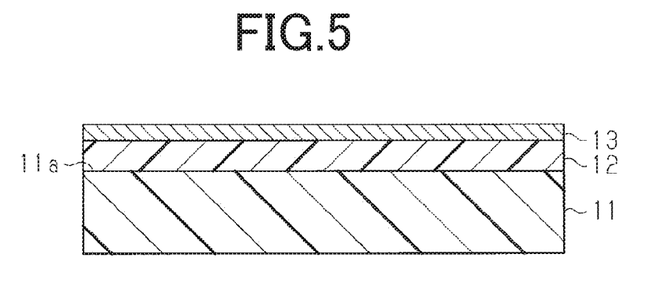
FIG. 5 is a process diagram which illustrates a step of producing a lower copper oxynitride layer in a method for producing a conductive laminate for a touch panel.

As shown in FIG. 5, in a step of forming the lower copper oxynitride layer 13, the lower copper oxynitride layer 13 is formed on the surface of the underlayer 12 opposite to the surface that is in contact with the substrate 11 by using a sputtering method.

The lower copper oxynitride layer 13 is formed, for example, by sputtering a copper target in the atmosphere containing a nitrogen gas and oxygen gas. When a flow rate of the nitrogen gas supplied to the atmosphere under which the target is sputtered is 400 sccm, for example, a flow rate of the oxygen gas is preferably in a range of 10 sccm or more and 100 sccm or less, more preferably in a range of 10 sccm or more and 40 sccm or less, and further more preferably 20 sccm.

Figure 6:
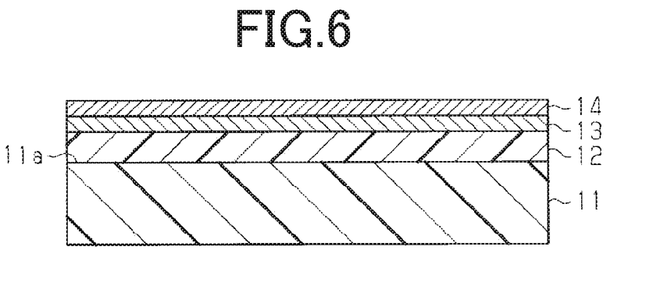
FIG. 6 is a process diagram which illustrates a step of producing a copper layer in a method for producing a conductive laminate for a touch panel.

As shown in FIG. 6, in a step of forming the copper layer 14, the copper layer 14 is formed on the surface of the lower copper oxynitride layer 13 opposite to the surface that is in contact with the underlayer 12 by using a sputtering method.

Then, the upper copper oxynitride layer 15 is formed on the surface of the copper layer 14 opposite to the surface that is in contact with the lower copper oxynitride layer 13 by using a sputtering method. Thus, the conductive laminate 10 for a touch panel is produced.

Furthermore, as with the lower copper oxynitride layer 13, the upper copper oxynitride layer 15 is formed, for example, by sputtering a copper target in the atmosphere containing a target nitrogen gas and oxygen gas. When a flow rate of the nitrogen gas supplied to the atmosphere under which the target is sputtered is 400 sccm, for example, a flow rate of the oxygen gas is preferably in a range of 10 sccm or more and 100 sccm or less, more preferably in a range of 10 sccm or more and 40 sccm or less, and further more preferably 20 sccm.

In the conductive laminate 10 for a touch panel, each of the lower copper oxynitride layer 13, the copper layer 14, and the upper copper oxynitride layer 15 are formed by using a sputtering method. Accordingly, a step of forming a layer that reduces light reflection by using wet processing such as plating for the electrodes formed of the lower copper oxynitride layer 13 and the copper layer 14 can be omitted. In addition, since both the lower copper oxynitride layer 13 and the upper copper oxynitride layer 15 are formed by using a sputtering method, difference in color between the lower copper oxynitride layer 13 and the upper copper oxynitride layer 15 can be reduced, for example compared with a case where the lower copper oxynitride layer 13 is formed by using a sputtering method but the upper copper oxynitride layer is formed by a plating method.

Further, difference in environment for forming a plurality of layers such as difference in degree of vacuum or difference in temperature can be easily reduced compared with a case where any of the lower copper oxynitride layer 13, the copper layer 14, and the upper copper oxynitride layer 15 is formed by using a different gas phase method, for example, a vapor deposition method. Accordingly, a machine for producing the conductive laminate 10 for a touch panel can have a simple configuration.

Effect of Conductive Laminate for Touch Panel

Figure 7:
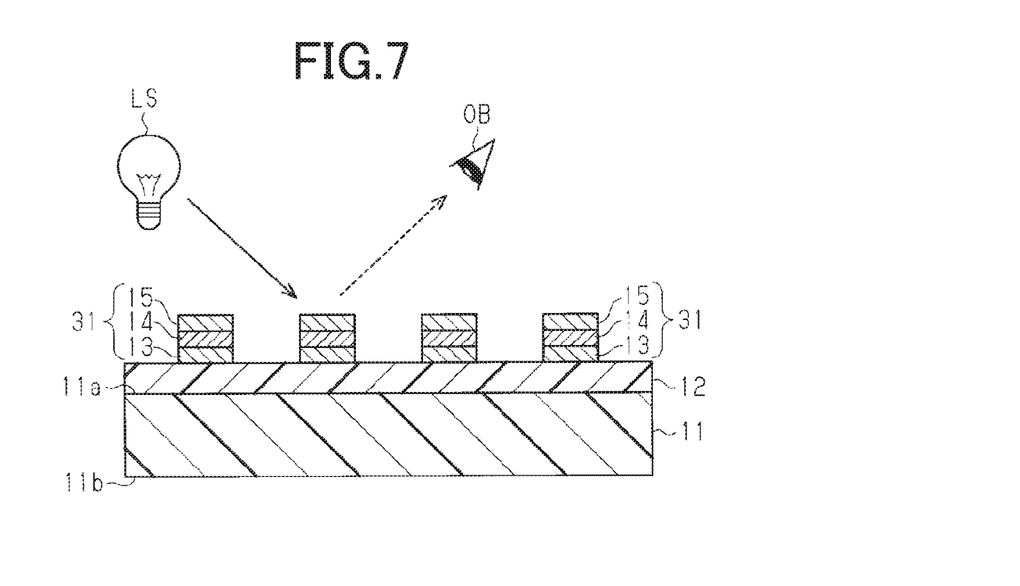
FIG. 7 is a view which illustrates an effect of the conductive laminate for a touch panel.
Figure 8:
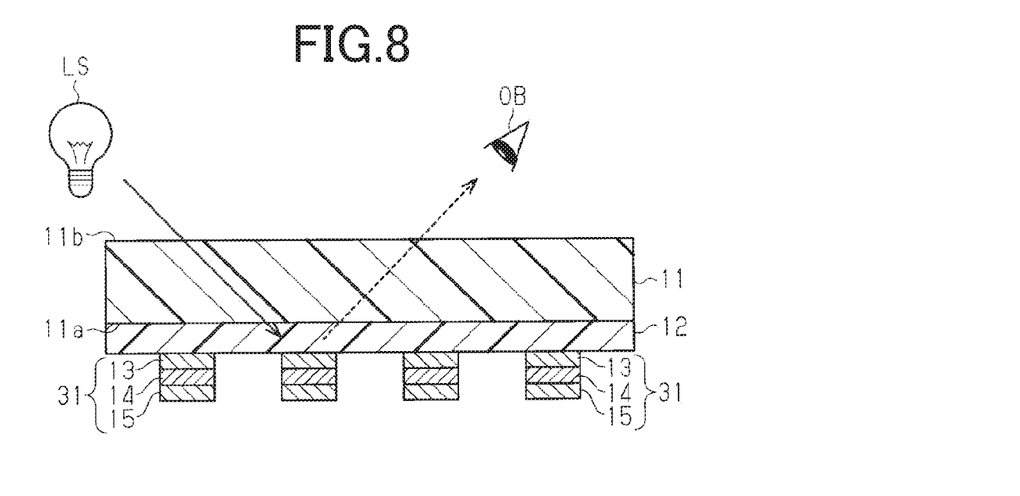
FIG. 8 is a view which illustrates an effect of the conductive laminate for a touch panel.

With reference to FIGS. 7 and 8, an effect of a conductive laminate for a touch panel will be described. FIGS. 7 and 8 each illustrate that a plurality of electrodes is formed on the underlayer 12 by etching the lower copper oxynitride layer 13, the copper layer 14, and the upper copper oxynitride layer 15 in the first laminate 16.

As shown in FIG. 7, the plurality of electrodes 31 is formed on the surface of the underlayer 12 opposite to the surface that is in contact with the substrate 11. Each electrode 31 includes the lower copper oxynitride layer 13, the copper layer 14, and the upper copper oxynitride layer 15, and extends in one direction on the first surface 11a of the substrate 11. The line width of the electrode 31 is, for example, in a range between several micrometers and several tens of micrometers.

When the plurality of electrodes 31 is viewed in a direction facing the first surface 11a, part of light emitted from a light source LS enters the upper copper oxynitride layer 15 of the electrode 31, and at least part of the light entering the upper copper oxynitride layer 15 is emitted from the upper copper oxynitride layer 15 toward an observer OB.

Since a light reflectivity of the upper copper oxynitride layer 15 is smaller than a light reflectivity of the copper layer 14, the amount of light emitted from the upper copper oxynitride layer 15 toward the observer OB decreases compared with the configuration in which the copper layer 14 is the outermost layer of the electrode 31. That is, the upper copper oxynitride layer 15 does not have a metallic luster like that of the copper layer 14, and is visually recognized as a brown or black layer with a low lightness.

As described above, the electrodes 31 have an extremely small line width of the order of several micrometers to several tens of micrometers. As a result, the electrodes 31 are not easily visually recognized by the observer OB in the direction facing the first surface 11a.

Further, since the Y value in the upper copper oxynitride layer 15 is 20% or less at the time of formation of the upper copper oxynitride layer 15, the lightness of the upper copper oxynitride layer 15 at the time when a short period of time has elapsed after the formation of the upper copper oxynitride layer 15 is so low that the layer is not visually recognized by the observer OB.

The lightness of the upper copper oxynitride layer 15 tends to increase as the upper copper oxynitride layer 15 deteriorates with time. However, since the Y value at the time of formation of the upper copper oxynitride layer 15 is 20% or less, the lightness of the upper copper oxynitride layer 15 is not likely to increase to the extent that the layer is visually recognized by the observer OB even when a long period of time has elapsed after the formation of the upper copper oxynitride layer 15. In other words, it takes a longer time until the lightness of the upper copper oxynitride layer 15 increases to the extent that the layer is visually recognized by the observer OB compared with the configuration having a higher Y value at the time of formation of the upper copper oxynitride layer 15.

As shown in FIG. 8, when the plurality of electrodes 31 is viewed in a direction facing the second surface 11b, that is, when the plurality of electrodes 31 is viewed via the substrate 11, the electrodes 31 are not easily visually recognized by the observer OB for the same reason as that when the plurality of electrodes 31 is viewed in a direction facing the first surface 11a. That is, as described above, the lower copper oxynitride layer 13 has a function as an adhesive layer between the underlayer 12 and the copper layer 14 and a function of reducing visual recognition of the plurality of electrodes 31.

Moreover, the plurality of electrodes formed on the second surface 11b of the substrate 11 can also obtain the same effects as those of the plurality of electrodes 31 formed on the first surface 11a.

EXAMPLES

Example 1

A polyethylene terephthalate sheet having a thickness of 100 μm was prepared as a substrate, and an underlayer having a thickness of 1.2 μm was formed on the first surface of the substrate by using a coating liquid. Then, a lower copper oxynitride layer was formed on the underlayer by using a sputtering method, and a copper layer was formed on the lower copper oxynitride layer by using a sputtering method. Furthermore, an upper copper oxynitride layer was formed on the copper layer by using a sputtering method. Thus, a conductive laminate for a touch panel of Example 1 was obtained. The upper copper oxynitride layer was formed under the following conditions.

| MF-band high frequency power supply | 6.0 kW |
|---|---|
| Argon gas flow rate | 100 sccm |
| Oxygen gas flow rate | 10 sccm |
| Nitrogen gas flow rate | 400 sccm |

Example 2

The conductive laminate for a touch panel of Example 2 was obtained in the same manner as Example 1 except for the conditions for forming the upper copper oxynitride layer were modified as below.

| MF-band high frequency power supply | 6.0 kW |
|---|---|
| Argon gas flow rate | 100 sccm |
| Oxygen gas flow rate | 100 sccm |
| Nitrogen gas flow rate | 400 sccm |

Acceleration Test

An acceleration test was performed for the conductive laminate for a touch panel of Example 1 and the conductive laminate for a touch panel of Example 2 under the following conditions.

Test Condition 1

Under the test conditions of temperature of 90° C. and relative humidity of 2% to 3% without humidification, the conductive laminate for a touch panels of Examples 1 and 2 were left for 120 hours, 240 hours, and 500 hours.

Test Condition 2

Under the test conditions of temperature of 60° C. and relative humidity of 90%, the conductive laminate for a touch panels of Examples 1 and 2 were left for 120 hours, 240 hours, and 500 hours.

Measurement Result

For the conductive laminate for a touch panels of Examples 1 and 2, each of Y value, L* value, a* value, and b* value of the upper copper oxynitride layer at the time of formation of the upper copper oxynitride layer were measured. Furthermore, for the conductive laminate for a touch panels of Examples 1 and 2 after the acceleration tests were performed for each elapsed time, each of Y value, L* value, a* value, and b* value of the upper copper oxynitride layer at the time of formation of the upper copper oxynitride layer were measured.

The Y value was measured by using a measurement method in accordance with JIS Z 8722. Further, the L* value, a* value, and b* value were measured by using a measurement method in accordance with JIS Z 8781-4. The measurement results are shown in Table 1 below.

TABLE 1

|  |  | Example 1 | | | | Example 2 | | | |
| --- | --- | --- | --- | --- | --- | --- | --- | --- | --- |
|  |  | Y | L* | a* | b* | Y | L* | a* | b* |
| Initial value |  | 18.9 | 50.6 | −15.0 | −4.5 | 18.5 | 50.2 | −9.2 | −10.0 |
| Conditions | Hours | | | | | | | | |
| 90° C./ | 120 | 21.2 | 53.1 | −12.1 | 2.4 | 19.4 | 51.1 | −4.1 | 4.0 |
| 2-3% RH | 240 | 21.7 | 53.7 | −11.4 | 3.6 | 53.1 | 77.9 | −5.7 | 8.0 |
|  | 500 | 21.5 | 53.5 | −9.5 | 6.9 | 59.5 | 81.6 | −2.6 | 21.0 |
| 60° C./ | 120 | 20.0 | 51.9 | −12.8 | 0.5 | 12.6 | 42.1 | −9.1 | −4.7 |
| 90% RH | 240 | 20.3 | 52.2 | −12.2 | 1.3 | 4.2 | 24.3 | 21.0 | −27.2 |
|  | 500 | 20.9 | 52.9 | −10.4 | 4.0 | 6.2 | 30.0 | 9.7 | −25.9 |

As shown in Table 1, in Example 1, it was found that the Y value of the upper copper oxynitride layer at the time of formation of the upper copper oxynitride layer, that is, the initial value of Y was 18.9%, and not more than 20%. Further, in Example 1, it was found that the initial value of L* was 50.6, the initial value of a* was −15.0, and the initial value of b* was −4.5.

In Example 2, it was found that the initial value of Y was 18.5%, and not more than 20%. Further, in Example 2, it was found that the initial value of L* was 50.2, the initial value of a* was −9.2, and the initial value of b* was −10.0.

Moreover, it was found that the amount of change from the initial value of each of the Y value, L* value, a* value, and b* value of the upper copper oxynitride layer in Example 1 is small compared with the upper copper oxynitride layer of Example 2.

Example 3

A polyethylene terephthalate sheet having a thickness of 100 μm was prepared as a substrate, and an underlayer having a thickness of 1.2 μm was formed on the first surface of the substrate by using a coating liquid. Then, a lower copper oxynitride layer having a thickness of 38 nm was formed on the underlayer by using a sputtering method, and a copper layer having a thickness of 500 nm was formed on the lower copper oxynitride layer by using a sputtering method. Furthermore, an upper copper oxynitride layer having a thickness of 38 nm was formed on the copper layer by using a sputtering method. Thus, a conductive laminate for a touch panel of Example 3 was obtained. The upper copper oxynitride layer and the lower copper oxynitride layer were formed under the following conditions. In example 3, it was found that a film formation speed of each of the upper copper oxynitride layer and the lower copper oxynitride layer was 44 nm·m/min.

| | |
| --- | --- |
| MF-band high frequency power supply | 9.3 kW |
| Argon gas flow rate | 100 sccm |
| Oxygen gas flow rate | 80 sccm |
| Nitrogen gas flow rate | 400 sccm |

Example 4

The conductive laminate for a touch panel of Example 4 was obtained in the same manner as Example 3 except for the oxygen gas flow rate among the conditions for forming the upper copper oxynitride layer and the lower copper oxynitride layer was modified as below. In Example 4, it was found that the film formation speed of each of the upper copper oxynitride layer and the lower copper oxynitride layer was the same as the film formation speed of Example 3.

| | |
| --- | --- |
| Oxygen gas flow rate | 40 sccm |

Example 5

The conductive laminate for a touch panel of Example 5 was obtained in the same manner as Example 3 except for the oxygen gas flow rate among the conditions for forming the upper copper oxynitride layer and the lower copper oxynitride layer was modified as below. In Example 5, it was found that the film formation speed of each of the upper copper oxynitride layer and the lower copper oxynitride layer was the same as the film formation speed of Example 3.

| | |
| --- | --- |
| Oxygen gas flow rate | 20 sccm |

Example 6

The conductive laminate for a touch panel of Example 6 was obtained in the same manner as Example 3 except for the oxygen gas flow rate among the conditions for forming the upper copper oxynitride layer and the lower copper oxynitride layer was modified as below. In Example 6, it was found that a film formation speed of each of the upper copper oxynitride layer and the lower copper oxynitride layer was the same as the film formation speed of Example 3.

| Oxygen gas flow rate | 10 sccm |
|---|---|

Example 7

The conductive laminate for a touch panel of Example 7 was obtained in the same manner as Example 5 except for the power of the MF-band high frequency power supply among the conditions for forming the upper copper oxynitride layer and the lower copper oxynitride layer was modified as below. In example 7, it was found that the film formation speed of each of the upper copper oxynitride layer and the lower copper oxynitride layer was 30 nm·m/min.

| MF-band high frequency power supply | 6.0 kW |
|---|---|

Example 8

The conductive laminate for a touch panel of Example 8 was obtained in the same manner as Example 3 except for the oxygen gas flow rate and the nitrogen gas flow rate among the conditions for forming the upper copper oxynitride layer and the lower copper oxynitride layer were modified as below. In Example 8, it was found that the film formation speed of each of the upper copper oxynitride layer and the lower copper oxynitride layer was the same as the film formation speed of Example 3.

| Oxygen gas flow rate | 20 sccm |
|---|---|
| Nitrogen gas flow rate | 200 sccm |

Comparative Example 1

The conductive laminate for a touch panel of Comparative Example 1 having the upper copper nitride layer and the lower copper nitride layer was obtained in the same manner as Example 3 except for the oxygen gas flow rate among the conditions for forming the upper copper oxynitride layer and the lower copper oxynitride layer was modified as below. In Comparative Example 1, it was found that the film formation speed of each of the upper copper nitride layer and the lower copper nitride layer was the same as the film formation speed of Example 3.

| Oxygen gas flow rate | 0 sccm |
|---|---|

Measurement Result of Optical Characteristics

For the conductive laminate for a touch panels of Examples 3 to 8, each of Y value, $L^*$ value, $a^*$ value, and $b^*$ value of the upper copper oxynitride layer at the time of formation of the upper copper oxynitride layer were measured. For the conductive laminate for a touch panel of Comparative Example 1, each of the Y value, $L^*$ value, $a^*$ value, and $b^*$ value of the upper copper nitride layer at the time of formation of the upper copper nitride layer were measured. Further, each of the Y value, $L^*$ value, $a^*$ value, and $b^*$ value were measured by the same method as that of Examples 1 and 2. The measurement results are shown in Table 2 below.

TABLE 2

|  | Y | $L^*$ | $a^*$ | $b^*$ | Evaluation |
|---|---|---|---|---|---|
| Example 3 | 15.7 | 46.5 | 5.8 | −20.2 | Δ |
| Example 4 | 16.6 | 47.8 | −14.4 | −12.4 | ○ |
| Example 5 | 17.9 | 49.4 | −15.1 | −9.0 | ○ |
| Example 6 | 18.7 | 50.3 | −10.5 | −8.3 | ○ |
| Example 7 | 17.0 | 48.3 | −15.8 | −10.7 | ○ |
| Example 8 | 19.1 | 50.8 | −13.3 | −7.0 | ○ |
| Comparative Example 1 | 23.5 | 55.6 | −0.8 | −3.7 | X |

As shown in Table 2, in Example 3, it was found that the initial value of Y in the upper copper oxynitride layer was 15.7%, and not more than 20%. Further, in Example 3, it was found that the initial value of $L^*$ was 46.5, the initial value of $a^*$ was 5.8, and the initial value of $b^*$ was −20.2.

In Example 4, it was found that the initial value of Y in the upper copper oxynitride layer was 16.6%, and not more than 20%. Further, in Example 4, it was found that the initial value of $L^*$ was 47.8, the initial value of $a^*$ was −14.4, and the initial value of $b^*$ was −12.4.

In Example 5, it was found that the initial value of Y in the upper copper oxynitride layer was 17.9%, and not more than 20%. Further, in Example 5, it was found that the initial value of $L^*$ was 49.4, the initial value of $a^*$ was −15.1, and the initial value of b was −9.0.

In Example 6, it was found that the initial value of Y in the upper copper oxynitride layer was 18.7%, and not more than 20%. Further, in Example 6, it was found that the initial value of $L^*$ was 50.3, the initial value of $a^*$ was −10.5, and the initial value of $b^*$ was −8.3.

In Example 7, it was found that the initial value of Y in the upper copper oxynitride layer was 17.0%, and not more than 20%. Further, in Example 7, it was found that the initial value of $L^*$ was 48.3, the initial value of $a^*$ was −15.8, and the initial value of $b^*$ was −10.7.

In Example 8, it was found that the initial value of Y in the upper copper oxynitride layer was 19.1%, and not more than 20%. Further, in Example 8, it was found that the initial value of $L^*$ was 50.8, the initial value of $a^*$ was −13.3, and the initial value of $b^*$ was −7.0.

In Comparative Example 1, it was found that the initial value of Y in the upper copper nitride layer was 23.5%, and not more than 20%. Further, in Comparative Example 1, it was found that the initial value of $L^*$ was 55.6, the initial value of $a^*$ was −0.8, and the initial value of $b^*$ was −3.7.

Evaluation of Initial Value of Optical Characteristics

As previously mentioned, while the initial value of Y of the upper copper oxynitride layer in Examples 3 to 8 was 20% or less, the initial value of Y of the upper copper nitride layer in Comparative Example 1 was more than 20%. As seen from the above, since the Y value at the initial stage of film formation of the copper oxynitride layer was smaller than that of the copper nitride layer, it was found that the copper oxynitride layer was more preferred than the copper nitride layer in that it had a color with lower lightness.

In addition, the upper copper oxynitride layer in Example 3 was easily visually recognized by the observer since the absolute value of b* was more than 20, and thus the chroma is higher than the other upper copper oxynitride layers and the color is stronger than the other upper copper oxynitride layers. Therefore, the upper copper oxynitride layer in Examples 4 to 8 was found to have particularly preferred optical characteristics in the above Examples.

Results of Composition Analysis

For the upper copper oxynitride layer in Examples 3 to 8 and the upper copper nitride layer in Comparative Example 1, surface composition analysis was performed. An Auger spectroscopy analysis apparatus (SAM-680, manufactured by ULVAC-PHI, Inc.) was used to measure the composition of the upper copper oxynitride layer and the upper copper nitride layer.

In the auger spectroscopy analysis apparatus, an acceleration voltage of an argon ion gun was set to 1 kV, an incident angle was set to 45 degrees, and an argon ion incident range on the sample was set to 1 mm square. The composition when the surface of the sample was etched for a period of 1 minute was measured. Further, the incident angle was an angle made by the incident direction of argon ion and the normal direction of the sample, and the etching rate by the argon ion gun was 7 nm/min when converted to $SiO_2$. Moreover, in the auger spectroscopy analysis apparatus, an acceleration voltage of an electron gun was set to 10 kV, and an electric current amount was set to 10 nA.

Table 3 shows a percentage by atom for each of the nitrogen atom (N), oxygen atom (O), and copper atom (Cu), and a relative ratio between two atoms in Examples 3 to 8 and Comparative Example 1. Regarding the relative ratio, a first relative ratio refers to a ratio of the nitrogen atoms to the copper atoms (N/Cu) in percentage, a second relative ratio refers to a ratio of the oxygen atoms to the copper atoms (O/Cu) in percentage, and a third relative ratio refers to a ratio of the nitrogen atoms to the oxygen atoms (N/O) in percentage.

TABLE 3

| | Percentage by atom | | | | Relative ratio (%) | | |
|---|---|---|---|---|---|---|---|
| | | | | | First relative ratio | Second relative ratio | Third relative ratio |
| | N | O | Cu | Total | (N/Cu) | (O/Cu) | (N/O) |
| Example 3 | 1 | 42 | 57 | 100 | 1 | 73 | 2 |
| Example 4 | 9 | 19 | 72 | 100 | 12 | 26 | 47 |
| Example 5 | 13 | 12 | 75 | 100 | 17 | 16 | 108 |
| Example 6 | 10 | 4 | 86 | 100 | 11 | 5 | 233 |
| Example 7 | 6 | 31 | 63 | 100 | 9 | 49 | 19 |
| Example 8 | 12 | 12 | 76 | 100 | 16 | 15 | 103 |
| Comparative Example 1 | 5 | 0 | 95 | 100 | 6 | 0 | — |

As shown in Table 3, in the upper copper oxynitride layer in Example 3, it was found that the nitrogen atom was 1% by atom, the oxygen atom was 42% by atom, and the copper atom was 57% by atom. Further, in the upper copper oxynitride layer of Example 3, it was found that the first relative ratio was 1%, the second relative ratio was 73%, and the third relative ratio was 2%.

In the upper copper oxynitride layer of Example 4, it was found that the nitrogen atom was 9% by atom, the oxygen atom was 19% by atom, and the copper atom was 72% by atom. Further, in the upper copper oxynitride layer of Example 4, it was found that the first relative ratio was 12%, the second relative ratio was 26%, and the third relative ratio was 47%.

In the upper copper oxynitride layer of Example 5, it was found that the nitrogen atom was 13% by atom, the oxygen atom was 12% by atom, and the copper atom was 75% by atom. Further, in the upper copper oxynitride layer of Example 5, it was found that the first relative ratio was 17%, the second relative ratio was 16%, and the third relative ratio was 108%.

In the upper copper oxynitride layer of Example 6, it was found that the nitrogen atom was 10% by atom the oxygen atom was 4% by atom, and the copper atom was 86% by atom. Further, in the upper copper oxynitride layer of Example 6, it was found that the first relative ratio was 11%, the second relative ratio was 5%, and the third relative ratio was 233%.

In the upper copper oxynitride layer of Example 7, it was found that the nitrogen atom was 6% by atom, the oxygen atom was 31% by atom, and the copper atom was 63% by atom. Further, in the upper copper oxynitride layer of Example 7, it was found that the first relative ratio was 9%, the second relative ratio was 49%, and the third relative ratio was 19%.

In the upper copper oxynitride layer of Example 8, it was found that nitrogen atom was 12% by atom, the oxygen atom was 12% by atom and the copper atom was 76% by atom. Further, in the upper copper oxynitride layer of Example 8, it was found that the first relative ratio was 16%, the second relative ratio was 15%, and the third relative ratio was 103%.

In the upper copper nitride layer of Comparative Example 1, it was found that the nitrogen atom was 5% by atom, the oxygen atom was 0% by atom, and the copper atom was 95% by atom. Further, in the upper copper nitride layer of Comparative Example 1, it was found that the first relative ratio was 6%, and the second relative ratio was 0%.

Evaluation of Characteristics

For the conductive laminate for a touch panel in Examples 3 to 8 and the conductive laminate for a touch panel in Comparative Example 1, the initial stability, the durability, and the processability were evaluated.

The initial stability refers to a stability of the optical characteristics of the upper copper oxynitride layer and the upper copper nitride layer for a period of five days after the upper copper oxynitride layer or the upper copper nitride layer is formed. Further, the optical characteristics include the above Y value, L* value, a* value, and b* value.

The initial stability was evaluated by the extent of change in the optical characteristics of the upper copper oxynitride layer and the upper copper nitride layer from the initial value, when the conductive laminate for a touch panel of Examples 3 to 8 and the conductive laminate for a touch panel of Comparative Example 1 were left in the atmosphere at normal temperature and normal pressure for a period of five days.

The durability refers to a durability of the optical characteristics of the upper copper oxynitride layer and the upper copper nitride layer, and a stability of the upper copper oxynitride layer and the upper copper nitride layer after the above period for evaluation of the initial stability has passed. In evaluation of durability, first, the conductive laminate for a touch panel in Examples 3 to 8, and the conductive laminate for a touch panel in Comparative Example 1 were left in an atmosphere of normal temperature and normal pressure for a period of five days.

Then, an acceleration test was performed for a period of 500 hours under the test condition 1 descried above for the conductive laminate for a touch panel in Examples 3 to 8, and the conductive laminate for a touch panel in Comparative Example 1. The durability was evaluated using the extent of change in the optical characteristics of the upper copper oxynitride layer and the upper copper nitride layer after the acceleration test to the optical characteristics before the acceleration test.

The processability refers to a processability in etching of the conductive laminate for a touch panel. The processability was evaluated by the shape of the electrodes obtained by etching the conductive laminate for a touch panel in Examples 3 to 8 and the conductive laminate for a touch panel in Comparative Example 1 with ferric chloride solution.

Table 4 below shows the evaluation results of the initial stability, the durability, and the processability. For initial stability, the conductive laminate for a touch panel having high stability was evaluated as "○", and the conductive laminate for a touch panel having low stability was evaluated as "x". For durability, the conductive laminate for a touch panel having the highest durability was evaluated as "○", the conductive laminate for a touch panel having the second-highest durability was evaluated as "Δ", the conductive laminate for a touch panel having low durability was evaluated as "x", and the conductive laminate for a touch panel having further lower durability was evaluated as "xx". For processability, the conductive laminate for a touch panel having the highest processability was evaluated as "⊚", the conductive laminate for a touch panel having the second-highest processability was evaluated as "○", the conductive laminate for a touch panel having the third-highest processability was evaluated as "Δ", and the conductive laminate for a touch panel having low processability was evaluated as "x".

TABLE 4

|  | Initial stability | Durability | Processability |
| --- | --- | --- | --- |
| Example 3 | ○ | XX | ⊚ |
| Example 4 | ○ | Δ | ⊚ |
| Example 5 | ○ | ○ | ○ |
| Example 6 | ○ | ○ | Δ |
| Example 7 | ○ | X | ⊚ |
| Example 8 | ○ | ○ | ○ |
| Comparative Example 1 | X | ○ | X |

As shown in Table 4, while the initial stability of the upper copper oxynitride layer in Examples 3 to 8 was high, the initial stability of the upper copper nitride layer in Comparative Example 1 was low. That is, compared with the copper nitride layer, an abrupt change in the optical characteristics is not likely to occur in the copper oxynitride layer immediately after the copper oxynitride layer is formed, and thus desired optical characteristics can be easily satisfied in the electrodes formed by using the conductive laminate for a touch panel.

In addition, the inventors have found that the results from the evaluation test for initial stability with the test period of three or four days exhibited the same tendency as the results from the same test with the test period of five days.

In the upper copper oxynitride layer in Example 3, it was found that the difference between the optical characteristics before the acceleration test and the optical characteristics after the acceleration test was approximately the same as that in Example 2 described above. Further, in the upper copper oxynitride layer in Examples 4 to 8 and the upper copper nitride layer in Comparative Example 1, it was found that the difference between the optical characteristics before the acceleration test and the optical characteristics after the acceleration test was smaller than that in Example 3.

It was found that the conductive laminate for a touch panel in Examples 3 to 8 had higher processability than the conductive laminate for a touch panel of Comparative Example 1. Further, it was found that the conductive laminate for a touch panel in Examples 3, 4, and 7 had the highest processability, and the conductive laminate for a touch panel in Examples 5 and 8 had the second-highest processability.

Specifically, in Comparative Example 1, the etching rate of the copper nitride layer was smaller than the etching rate of the copper layer. Accordingly, in order to satisfy a desired line width in the copper nitride layer, the line width in the copper layer must be decreased. As a result, the line width in part of the plurality of electrodes became so small that it may cause disconnection.

On the other hand, in Examples 3 to 8, the difference between the etching rate of the copper layer and the etching rate of the copper oxynitride layer was smaller than the difference between the etching rate of the copper layer and the etching rate of the copper nitride layer. Accordingly, the difference between the line widths of the respective layers was small, and almost no disconnection was found in the plurality of electrodes. Further, in Examples 3 to 8, there was almost no difference between the line widths of the respective layers in Examples 3, 4, and 7.

Relationship Between Compositions and Characteristics in Upper Copper Oxynitride Layer As seen from Tables 2, 3, and 4, the conductive laminate for a touch panel having the copper oxynitride layer was advantageous over that having the copper nitride layer in the three points, that is, a low initial value of Y; stable optical characteristics in the initial period after film formation; and good processability.

Further, according to the copper oxynitride layer particularly containing oxygen atoms in a range of 4% by atom or more and 19% by atom or less, durability against change in optical characteristics was improved. Moreover, according to the copper oxynitride layer particularly containing oxygen atoms in a range of 12% by atom or more and 42% by atom or less, processability for wet etching was improved. Furthermore, according to the copper oxynitride layer particularly containing oxygen atoms in a range of 19% by atom or more and 42% by atom or less, processability for wet etching was further improved.

Moreover, according to the copper oxynitride layer containing oxygen atoms of 12% by atom, preferred characteristics were achieved in all of the initial values of optical characteristics, durability, and processability.

On the other hand, according to the copper oxynitride layer with the first relative ratio of 11% or more and 17% or less, durability against change in optical characteristics was improved. In other words, durability against change in optical characteristics in the copper oxynitride layer was improved by containing oxygen while the relative ratio of the nitrogen atom to the copper atom was 11% or more and 17% or less.

Adhesive Strength

The adhesive strength at the interface between the underlayer and the lower copper oxynitride layer was measured for Examples 4 to 7. The adhesive strength was measured by a method in accordance with JIS K 6854-3. In measurement of the adhesive strength in Examples 4 to 7, for the purpose of increasing the thickness of the conductive laminate for a touch panel, the upper copper oxynitride layer was removed and then a copper layer having a thickness of 15 μm was formed on the copper layer. In each Example, the width of the sample was set to 15 mm, and the tensile speed was set to 50 mm/min.

The adhesive strength in Example 4 was 8.0 N/15 mm, the adhesive strength in Example 5 was 8.4 N/15 mm, the adhesive strength in Example 6 was 8.3 N/15 mm, and the adhesive strength in Example 7 was 8.2 N/15 mm. As seen from the above, it was found that the adhesive strength in Examples was 8.0 N/15 mm or more.

In addition, according to the conductive laminate for a touch panel having such an adhesive strength, it was found that disconnection in the electrodes was reduced during formation of the electrodes by etching the conductive laminate for a touch panel. Further, in the measurement test for adhesive strength in Examples 4 to 7, there was interfacial fracture at the interface between the underlayer and the lower copper oxynitride layer.

Surface Resistivity

The surface resistivity of the laminate of the conductive laminate for a touch panel was measured for Examples 3 to 7, and Comparative Example 1. That is, the surface resistivity of the laminate having the lower copper oxynitride layer, the copper layer, and the upper copper oxynitride layer are laminated in this order was measured in Examples 3 to 7, and the surface resistivity of the laminate having the lower copper nitride layer, the copper layer, and the upper copper nitride layer laminated in this order was measured in Comparative Example 1. The surface resistivity of each laminate was measured by using a method in accordance with JIS K 7194. For measurement of the surface resistivity, a resistivity meter (Loresta GP, manufactured by Mitsubishi Chemical Analytech, Co., Ltd.) was used.

The surface resistivity in Example 3 was 0.13 Ω/sq., the surface resistivity in Example 4 was 0.13 Ω/sq., the surface resistivity in Example 5 was 0.13 Ω/sq., the surface resistivity in Example 6 was 0.12 Ω/sq., the surface resistivity in Example 7 was 0.13 Ω/sq., and the surface resistivity in Example 8 was 0.13 Ω/sq. Further, the surface resistivity in Comparative Example 1 was 0.12 Ω/sq. As seen from the above, it was found that the surface resistivity in Examples was 0.13 Ω/sq. or less.

According to the conductive laminate for a touch panel having such a surface resistivity, it was found that resistance of the electrodes formed by using the conductive laminate for a touch panel was so small that it rarely affects the response speed of the touch sensor.

As described above, according to an embodiment of the conductive laminate for a touch panel and the method for producing a conductive laminate for a touch panel, the following effects can be achieved.

(1) The copper layer 14 is sandwiched between two copper oxynitride layers having a reflectivity lower than that of the copper layer 14. Accordingly, the plurality of electrodes 31 formed by using the conductive laminate 10 for a touch panel are not easily visually recognized when viewed in a direction facing a first surface 11a, and the electrodes 31 are not easily visually recognized via the substrate 11.

(2) In the plurality of electrodes formed by using the second laminate 20, light reflection is reduced by the lower copper oxynitride layer 22 and the upper copper oxynitride layer 24. Accordingly, the plurality of electrodes on the second surface 11b are not easily visually recognized when viewed in a direction facing the second surface 11b, and the electrodes are not easily visually recognized via the substrate 11.

(3) Since the underlayer contains the anti-blocking agent, the upper copper oxynitride layer is prevented from being adhered to a layer stacked on the upper copper oxynitride layer when the conductive laminate 10 for a touch panel is wound up or stacked. Further, since the underlayer fills the recesses 11c of the substrate 11, and is disposed on the substrate 11 as a layer, the surface of the underlayer that is in contact with the lower copper oxynitride layer has an improved flatness. Accordingly, each of the layers in the conductive laminate 10 for a touch panel has an improved flatness.

(4) Since the thickness of the lower copper oxynitride layer is in a range of 30 nm or more and 50 nm or less, the lower copper oxynitride layer has a thickness sufficient to enhance adhesiveness between the substrate 11 on which the underlayer is formed and the copper layer. Furthermore, since the thickness of the lower copper oxynitride layer is 25% or less of the thickness of the copper layer, the entire thickness of the conductive laminate 10 for a touch panel and the amount of copper used in the conductive laminate 10 for a touch panel can be prevented from excessively increasing while maintaining adhesiveness between the substrate 11 and the copper layer.

(5) The Y value, which is an index of lightness, of the XYZ color system in the upper copper oxynitride layer is 20% or less. Accordingly, in the plurality of electrodes formed by using the conductive laminate 10 for a touch panel, the electrodes are not easily visually recognized in a direction facing the upper copper oxynitride layer. Further, since the Y value at the time of formation of the upper copper oxynitride layer is 20% or less, the Y value is not likely to increase to the extent that the upper copper oxynitride layer is visually recognized.

(6) Since the lower copper oxynitride layer and the upper copper oxynitride layer contain oxygen atoms in a range of 4% by atom or more and 19% by atom or less, durability against change in optical characteristics can be improved.

(7) When adhesive strength at the interface between the underlayer and the lower copper oxynitride layer is 8.0 N/15 mm or more, part of electrodes formed by patterning is resistant to peeling off from the underlayer, and thus disconnection in the electrodes can be reduced.

(8) When the surface resistivity of the conductive laminate 10 for a touch panel is 0.13 Ω/sq. or less, the resistance of the electrodes is so small that it rarely affects on the response speed of the touch sensor.

(9) When the surface roughness Ra of the surface of the underlayer is 3 nm or more, the laminate readily obtains anti-blocking properties.

(10) Further, when the surface roughness Ra of the surface of the underlayer is 20 nm or less, scattering of light at the electrodes formed of the laminate is prevented from increasing to the extent of being visually recognized by a user of the touch panel.

The above embodiment may be appropriately modified as below.

The surface roughness Ra of the surface of the underlayer may be less than 3 nm or more than 20 nm. In this configuration as well, it is possible to prevent significant unevenness from being formed on the respective layers of the conductive laminate for a touch panel compared with the configuration in which the surface roughness that serves to improve anti-blocking properties of the underlayer is formed by the recesses on the surface of the substrate which is oriented to the lower copper oxynitride layer since the underlayer is disposed between the substrate and the lower copper oxynitride layer.

The surface resistivity of the conductive laminate for a touch panel may be more than 0.13 Ω/sq. as long as it is within a range that provides the resistance required for the electrodes formed by using the conductive laminate for a touch panel, and thus the detection accuracy required for the touch panel.

The adhesive strength at the interface between the underlayer and the lower copper oxynitride layer may be smaller than 8.0 N/15 mm as long as it is within such a range that the lower copper oxynitride layer is not peeled off from the underlayer by processing of the conductive laminate for a touch panel.

At least one of the upper copper oxynitride layer and the lower copper oxynitride layer may contain oxygen atoms of less than 4% by atom or more than 19% by atom. In this configuration as well, the electrodes are not easily visually recognized via the substrate 11 as long as the conductive laminate for a touch panel includes the upper copper oxynitride layer and the lower copper oxynitride layer.

The initial value of Y of the lower copper oxynitride layer is not necessarily 20% or less. Even if the initial value of Y of the lower copper oxynitride layer is more than 20%, the electrodes are not easily visually recognized via the substrate 11 as long as the lower copper oxynitride layer is provided.

The initial value of Y of the upper copper oxynitride layer is not necessarily 20% or less. Even if the initial value of Y of the upper copper oxynitride layer is more than 20%, the electrodes are not easily visually recognized in the direction facing the surface on which the electrodes are formed as long as the upper copper oxynitride layer is provided.

The thickness of the copper layer may be less than 200 nm or more than 500 nm. The only requirement for the thickness of the copper layer is to satisfy conductivity required as an electrode when the electrodes are formed by using the conductive laminate for a touch panel.

The thickness of the lower copper oxynitride layer may be less than 30 nm or more than 50 nm. Further, the thickness of the lower copper oxynitride layer may be a value more than 25% of the thickness of the copper layer. The only requirement for the thickness of the lower copper oxynitride layer is to exhibit adhesiveness to both the substrate on which the underlayer is formed and the copper layer, and the thickness of the lower copper oxynitride layer is not limited to the ranges described in the above embodiment.

The coating liquid for forming the underlayer may not necessarily include at least one of the ultraviolet-curable multifunctional acrylate, ultraviolet-curable monofunctional acrylate, acrylic polymer, and anti-blocking agent as long as the underlayer formed by using the coating liquid has adhesiveness to the substrate 11 and the lower copper oxynitride layer. Alternatively, the underlayer may be made of thermoplastic resin, heat-curable resin or the like as long as it has adhesiveness to the substrate 11 and the lower copper oxynitride layer.

The line width of the electrodes 31 may be more than several tens of micrometers. In this configuration as well, the electrodes 31 are not easily visually recognized as long as the electrodes 31 include the lower copper oxynitride layer and the upper copper oxynitride layer, compared with the configuration in which the electrodes 31 are formed by only a metal layer.

The lower copper oxynitride layer, the copper layer, and the upper copper oxynitride layer may be formed by a method other than the sputtering method. For example, a gas phase method such as vapor deposition method or CVD method may also be used.

The present invention has an aspect of providing a conductive laminate for a touch panel that prevents electrodes which are formed by using the conductive laminate for a touch panel from being easily visually recognized, and providing a method for producing a conductive laminate for a touch panel.

One point to note is that electrodes made of a metal, which reflect light on the surface of the electrodes, have resistance lower than that of electrodes made of transparent conducting oxide. However, these electrodes are likely to be visually recognized by a user of the touch panel. Accordingly, in touch panels having a plurality of electrodes made of a metal, there is a need to prevent the electrodes from being easily visually recognized.

A conductive laminate for a touch panel which addresses the above point includes: a substrate which is light-transmitting and includes one surface; an underlayer which is light-transmitting and is disposed on the one surface of the substrate; a first copper oxynitride layer which is disposed on a surface of the underlayer opposite to a surface that is in contact with the substrate; a copper layer which is disposed on a surface of the first copper oxynitride layer opposite to a surface that is in contact with the underlayer; and a second copper oxynitride layer which is disposed on a surface of the copper layer opposite to a surface that is in contact with the first copper oxynitride layer.

A method for producing a conductive laminate for a touch panel for solving the above problem includes: forming an underlayer on at least one surface of a substrate; forming a first copper oxynitride layer on a surface of the underlayer opposite to a surface that is in contact with the substrate by using a sputtering method; forming a copper layer on a surface of the first copper oxynitride layer opposite to a surface that is in contact with the underlayer by using a sputtering method; and forming a second copper oxynitride layer on a surface of the copper layer opposite to a surface that is in contact with the first copper oxynitride layer by using a sputtering method.

According to the above configuration, the copper layer is sandwiched between two copper oxynitride layers having a reflectivity lower than that of the copper layer. Accordingly, in the plurality of electrodes formed by using the conductive laminate for a touch panel, light reflection is reduced by the two copper oxynitride layers. As a result, the electrodes are not easily visually recognized when viewed in a direction facing a first surface, and the electrodes are not easily visually recognized via the substrate.

A conductive laminate for a touch panel for solving the above problem includes: a substrate including a first surface and a second surface opposite to the first surface; an underlayer which is light-transmitting and disposed on each of the first surface and the second surface; a first copper oxynitride layer which is disposed on a surface of the underlayer opposite to a surface that is in contact with the substrate; a copper layer which is disposed on a surface of the first copper oxynitride layer opposite to a surface that is in contact with the underlayer; and a second copper oxynitride layer which is disposed on a surface of the copper layer opposite to a surface that is in contact with the first copper oxynitride layer.

According to the above configuration, the copper layer is sandwiched between two copper oxynitride layers having a reflectivity lower than that of the copper layer. Accordingly, in the plurality of electrodes formed by using the conductive laminate for a touch panel, light reflection is reduced by the two copper oxynitride layers. As a result, the electrodes are also not easily visually recognized when viewed in a direction facing a second surface.

In the above conductive laminate for a touch panel, it is preferred that the underlayer includes ultraviolet-curable multifunctional acrylate, ultraviolet-curable monofunctional acrylate, acrylic polymer having an ultraviolet-curable acrylic group, and an anti-blocking agent that reduces adhesiveness of a surface of the second copper oxynitride layer opposite to the copper layer, and the underlayer fills a plurality of recesses formed on the surface of the substrate that is in contact with the underlayer.

According to the above configuration, since the underlayer contains the anti-blocking agent, the second copper oxynitride layer is prevented from being adhered to a layer stacked on the second copper oxynitride layer when the conductive laminate for a touch panel is rolled or stacked. Further, since the underlayer fills the recesses of the substrate, and is disposed on the substrate as a layer, the surface of the underlayer that is in contact with the first copper oxynitride layer has improved flatness. Accordingly, each of the layers in the conductive laminate for a touch panel has improved flatness.

In the above conductive laminate for a touch panel, it is preferred that the thickness of the copper layer is in a range of 200 nm or more and 500 nm or less, and the thickness of the first copper oxynitride layer is in a range of 30 nm or more and 50 nm or less, and is 25% or less of the thickness of the copper layer.

According to the above configuration, since the thickness of the first copper oxynitride layer is in a range of 30 nm or more and 50 nm or less, the first copper oxynitride layer has a thickness sufficient to enhance adhesiveness between the substrate and the copper layer. Furthermore, since the thickness of the first copper oxynitride layer is 25% or less of the thickness of the copper layer, the entire thickness of the conductive laminate for a touch panel and the amount of copper used in the conductive laminate for a touch panel can be prevented from excessively increasing while maintaining adhesiveness between the substrate and the copper layer.

In the above conductive laminate for a touch panel, it is preferred that a Y value, which is one of tristimulus values in an XYZ color system in the second copper oxynitride layer, at the time when the second copper oxynitride layer is formed, is 20% or less.

According to the above configuration, the Y value, which is an index of lightness, of the XYZ color system in the second copper oxynitride layer is 20% or less. Accordingly, in the plurality of electrodes formed by using the conductive laminate for a touch panel, the electrodes are not easily visually recognized when viewed in a direction facing the second copper oxynitride layer. Further, since the Y value at the time of formation of the second copper oxynitride layer is 20% or less, the Y value is not likely to increase to the extent that the second copper oxynitride layer is visually recognized.

In the above conductive laminate for a touch panel, it is preferred that at least one of the first copper oxynitride layer and the second copper oxynitride layer contains oxygen atoms in a range of 4% by atom or more and 19% by atom or less.

According to the above configuration, of the first copper oxynitride layer and second copper oxynitride layer, the layer which contains oxygen atoms in a range of 4% by atom or more and 19% by atom or less has an improved durability against change in optical characteristics.

In the above conductive laminate for a touch panel, it is preferred that an adhesion strength at an interface between the underlayer and the first copper oxynitride layer is 8.0 N/15 mm or more.

According to the above configuration, part of the electrodes formed by patterning the conductive laminate for a touch panel is resistant to peeling off from the underlayer during patterning, and thus disconnection in the electrodes can be reduced.

In the above conductive laminate for a touch panel, it is preferred that a surface resistivity in a laminate composed of the first copper oxynitride layer, the copper layer and the second copper oxynitride layer is 0.13 Ω/sq. or less.

According to the above configuration, the resistance of the electrodes formed by using the conductive laminate for a touch panel is so small that it rarely affects the response speed of the touch sensor.

In the above conductive laminate for a touch panel, it is preferred that a surface roughness Ra of a surface of the underlayer that is in contact with the first copper oxynitride layer is 3 nm or more and 20 nm or less.

According to the above configuration, since the surface roughness Ra is 3 nm or more, a laminate composed of the underlayer, the first copper oxynitride layer, the copper layer, and the second copper oxynitride layer more easily obtains anti-blocking properties. Further, when the surface roughness Ra is 20 nm or less, scattering of light at the electrodes formed of the above laminate is prevented from increasing to the extent of being visually recognized by a user of the touch panel.

According to the embodiments of the present invention, electrodes formed by using the conductive laminate for a touch panel are prevented from being easily visually recognized.

REFERENCE SIGNS LIST

10 . . . Conductive laminate for a touch panel, 11 . . . Substrate, 11a . . . First surface, 11b . . . Second surface, 11c . . . Recess, 12, 21 . . . Underlayer, 13, 22 . . . Lower copper oxynitride layer, 14, 23 . . . Copper layer, 15, 24 . . . Upper copper oxynitride layer, 16 . . . First laminate. 20 . . . Second laminate, 31 . . . Electrode Obviously, numerous modifications and variations of the present invention are possible in light of the above teachings. It is therefore to be understood that within the scope of the appended claims, the invention may be practiced otherwise than as specifically described herein.

What is claimed is:

1. A conductive laminate for a touch panel, comprising:
   a substrate which is light-transmitting;
   an underlayer which is light-transmitting and formed on at least one surface of the substrate;
   a first copper oxynitride layer formed on the underlayer on an opposite side of the substrate;
   a copper layer formed on the first copper oxynitride layer on an opposite side of the underlayer; and
   a second copper oxynitride layer formed on the copper layer on an opposite side of the first copper oxynitride layer,
   wherein oxygen atoms of the second copper oxynitride layer are in a range of 12% or more by atom and 42% or less by atom.

2. The conductive laminate of claim 1, wherein the underlayer, the first copper oxynitride layer, the copper layer, and the second copper oxynitride layer form a laminate structure, and the laminate structure is formed on a first surface of the substrate and a second surface of the substrate opposite to the first surface such that the underlayer of the first structure is in contact with the first surface and the underlayer of the second structure is in contact with the second surface.

3. The conductive laminate of claim 1, wherein the underlayer comprises an ultraviolet-curable multifunctional acrylate, an ultraviolet-curable monofunctional acrylate, an acrylic polymer having an ultraviolet-curable acrylic group, and an anti-blocking agent that reduces adhesiveness of a surface of the second copper oxynitride layer on an opposite side of the copper layer, and the underlayer is formed on the substrate such that the underlayer fills a plurality of recesses formed on the surface of the substrate.

4. The conductive laminate of claim 2, wherein the underlayer comprises an ultraviolet-curable multifunctional acrylate, an ultraviolet-curable monofunctional acrylate, an acrylic polymer having an ultraviolet-curable acrylic group, and an anti-blocking agent that reduces adhesiveness of a surface of the second copper oxynitride layer on an opposite side of the copper layer, and the underlayer is formed on the substrate such that the underlayer fills a plurality of recesses formed on each of the first and second surfaces.

5. The conductive laminate of claim 1, wherein the copper layer has a thickness in a range of from 200 nm to 500 nm, and the first copper oxynitride layer has a thickness which falls within a range of from 30 nm to 50 nm and is 25% or less of the thickness of the copper layer.

6. The conductive laminate of claim 1, wherein the second copper oxynitride layer is formed such that the second copper oxynitride layer has a Y value in an XYZ color system of 20% or less when the second copper oxynitride layer is formed.

7. The conductive laminate of claim 1, wherein the first copper oxynitride layer includes an oxygen atom in a range of from 4% by atom to 19% by atom.

8. The conductive laminate of claim 1, wherein the underlayer and the first copper oxynitride layer are formed such that an adhesion strength at an interface between the underlayer and the first copper oxynitride layer is 8.0 N/15 mm or more.

9. The conductive laminate of claim 5, wherein a laminate including the first copper oxynitride layer, the copper layer and the second copper oxynitride layer has a surface resistivity of 0.13 Ω/sq. or less.

10. The conductive laminate of claim 1, wherein a surface of the underlayer in contact with the first copper oxynitride layer has a surface roughness Ra in a range of from 3 nm to 20 nm.

11. A method of producing the conductive laminate of claim 1, comprising:

forming the underlayer on the at least one surface of the substrate;

forming the first copper oxynitride layer on the underlayer on the opposite side of the substrate by sputtering;

forming the copper layer on the first copper oxynitride layer on the opposite side of the underlayer by sputtering; and forming the second copper oxynitride layer on the copper layer on the opposite side of the first copper oxynitride layer by sputtering.

12. The method of claim 11, wherein the forming of the underlayer includes forming the underlayer on each of a first surface of the substrate and a second surface opposite to the first surface.

\* \* \* \* \*